US012106973B2

(12) United States Patent
Hendarto

(10) Patent No.: US 12,106,973 B2
(45) Date of Patent: Oct. 1, 2024

(54) TWO-STEP DECAPSULATION TECHNIQUE FOR SEMICONDUCTOR PACKAGE HAVING SILVER BOND WIRES

(71) Applicant: Silicon Laboratories Inc., Austin, TX (US)

(72) Inventor: Erwin Hendarto, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 372 days.

(21) Appl. No.: 17/513,037

(22) Filed: Oct. 28, 2021

(65) Prior Publication Data

US 2023/0138508 A1    May 4, 2023

(51) Int. Cl.
| | |
|---|---|
| *H01L 21/56* | (2006.01) |
| *B23K 26/362* | (2014.01) |
| *B23K 101/40* | (2006.01) |
| *H01L 21/67* | (2006.01) |
| *H01L 23/00* | (2006.01) |
| *H01L 23/31* | (2006.01) |
| *H01L 23/552* | (2006.01) |

(52) U.S. Cl.
CPC .......... *H01L 21/565* (2013.01); *B23K 26/362* (2013.01); *H01L 21/67075* (2013.01); *H01L 23/3157* (2013.01); *H01L 23/552* (2013.01); *H01L 24/49* (2013.01); *B23K 2101/40* (2018.08); *H01L 2924/01047* (2013.01); *H01L 2924/18165* (2013.01)

(58) Field of Classification Search
CPC ... H01L 23/3157; H01L 23/552; H01L 24/49; H01L 2924/01047; H01L 2924/18165; H01L 25/18; H01L 24/45; H01L 24/48; H01L 24/85; H01L 21/67126; H01L 21/67075; B23K 26/362; B23K 2101/40
See application file for complete search history.

(56) References Cited

U.S. PATENT DOCUMENTS

| | | | |
|---|---|---|---|
| 4,340,456 | A | 7/1982 | Robinson et al. |
| RE43,980 | E | 2/2013 | Lowry |

FOREIGN PATENT DOCUMENTS

| | | | |
|---|---|---|---|
| KR | 20050033693 A | * | 4/2005 |
| NL | 2017198 | | 7/2016 |
| WO | 2018016957 | | 1/2018 |

OTHER PUBLICATIONS

M. J. Lefevre et al.; "Repeatable Method for Automated Decapsulation of Silver Alloy Wire Packages," Conference: ISTFA 2015 Portland, Oregon, 2015, pp. 496-500, doi: 10.31399/asm.cp.istfa2015p0491. (Year: 2015).*

(Continued)

*Primary Examiner* — John P. Dulka
(74) *Attorney, Agent, or Firm* — Trop, Pruner & Hu, P.C.

(57) ABSTRACT

In one embodiment, a method includes: laser ablating an encapsulant of a semiconductor package, until a threshold amount of the encapsulant remains above one or more die of the semiconductor package; and providing at least one drop of acid onto a surface of the ablated semiconductor package to acid etch for a first time duration, to remove a remaining portion of the encapsulant above the one or more die, where after the acid etch, a die of interest is exposed and the silver bond wires of the semiconductor package are preserved.

20 Claims, 4 Drawing Sheets

(56) References Cited

OTHER PUBLICATIONS

M. J. Lefevre et al.; "New method for decapsulation of copper wire devices using LASER and sub-ambient temperature chemical etch," 2011 IEEE 13th Electronics Packaging Technology Conference, Singapore, 2011, pp. 769-773, doi: 10.1109/EPTC.2011.6184523. (Year: 2011).*
Digit Concept FA Solutions and HighTech Equipment; Decapsulation Guide; published Nov. 2012; pp. 1-21. (Year: 2012).*
Erwin Hendarto, "PROSLIC Ag Wire Laser and Acid Decapsulation Procedures," Silicon Labs, May 27, 2016, pp. 1-4.

* cited by examiner

TWO-STEP DECAPSULATION TECHNIQUE FOR SEMICONDUCTOR PACKAGE HAVING SILVER BOND WIRES

BACKGROUND

New materials are continuously being researched and incorporated in semiconductor devices as the industry continues to evolve. Bond wires inside packaged devices are typically made of gold (Au) or copper (Cu). Material suppliers are recently offering silver (Ag) wires as an alternative. Ag wire offers many advantages over Cu wires.

However, one of the challenges to be overcome with the adoption of Ag wires is in failure analysis. Ag wire is softer than Cu wire and is not resistant to acid that is typically used during decapsulation to remove the mold compound around and at the top of the die. In general, during a conventional decapsulation process an acid is used while the device is at a relatively high temperature (e.g., greater than approximately 150 degrees Celsius), and is exposed to the acid for a relatively long duration. But during such process, Ag wires will be overetched when exposed to acid at such high temperatures, which can adversely affect electrical characteristics and even the ability to perform failure analysis.

SUMMARY OF INVENTION

In one aspect, a method includes: laser ablating an encapsulant of a semiconductor package, until a threshold amount of the encapsulant remains above one or more die of the semiconductor package; and providing at least one drop of acid onto a surface of the ablated semiconductor package to acid etch for a first time duration, to remove a remaining portion of the encapsulant above the one or more die, where after the acid etch, the one or more die are sufficiently exposed and the silver bond wires of the semiconductor package are exposed and preserved.

In an example, the method further comprises iteratively providing a single drop of the acid onto the surface of the ablated semiconductor package until the one or more die are sufficiently exposed and the silver bond wires are exposed. The method may further comprise iteratively providing a single drop of the acid comprising fuming nitric acid onto the surface of the ablated semiconductor package and thereafter rinsing the ablated semiconductor package, until the one or more die are sufficiently exposed and the silver bond wires are exposed.

In an example, the method further comprises: adapting the ablated semiconductor package on a hot plate having a temperature of less than approximately 65 degrees Celsius, and providing at least one drop of acid onto the surface of the ablated packaged device while on the hot plate having the temperature of less than approximately 65 degrees Celsius. The first time duration may be less than 20 seconds. The method may include rinsing the ablated semiconductor package of the acid. The method may include sonicating the ablated semiconductor package after the rinsing. The method may include drying the ablated semiconductor package after the sonicating. The method may include exposing one or more gold bond wires of the semiconductor package via the laser ablating and the acid etching.

In an example, exposing the silver bond wires comprises exposing one or more silver bond wires coupled between a first die and a second die of the semiconductor package. The laser ablating may include executing a plurality of scans of the semiconductor package to laser ablate until the threshold amount of the encapsulant remains, which in an example may be substantially one micron thick.

In another aspect, a system includes multiple workspace environments. A first workspace environment may comprise a laser to laser ablate mold compound from a semiconductor package, and a controller coupled to the laser to control the laser to execute a plurality of scans to laser ablate the mold compound to a threshold level. A second workspace environment may include: a hot plate; and a fume hood adapted about the hot plate, where the laser ablated semiconductor package is to be adapted to the hot plate and to be acid etched to expose one or more silver bond wires and one or more die of the semiconductor package, where a total time of exposure of the semiconductor package to the acid etch is less than two minutes.

In an example, the controller is to control the laser to laser ablate the mold compound to the threshold level at which one or more die of the semiconductor package remain covered with at least a portion of the mold compound. The controller may control the laser to have a first power, a first current, and a first scan angle for the laser ablation. The system may further include a non-transitory storage medium comprising instructions, where the controller is to execute the instructions to cause the laser to execute the plurality of scans. The first workspace environment may have a support assembly on which the semiconductor package is to be adapted. During the laser ablation, the laser may be positioned at an angle of approximately 90 degrees with respect to the support assembly. The system may further include sonication means for sonicating the semiconductor device after the acid etch, and rinsing means for rinsing the semiconductor device after the acid etch.

DETAILED DESCRIPTION

Figure 1A:
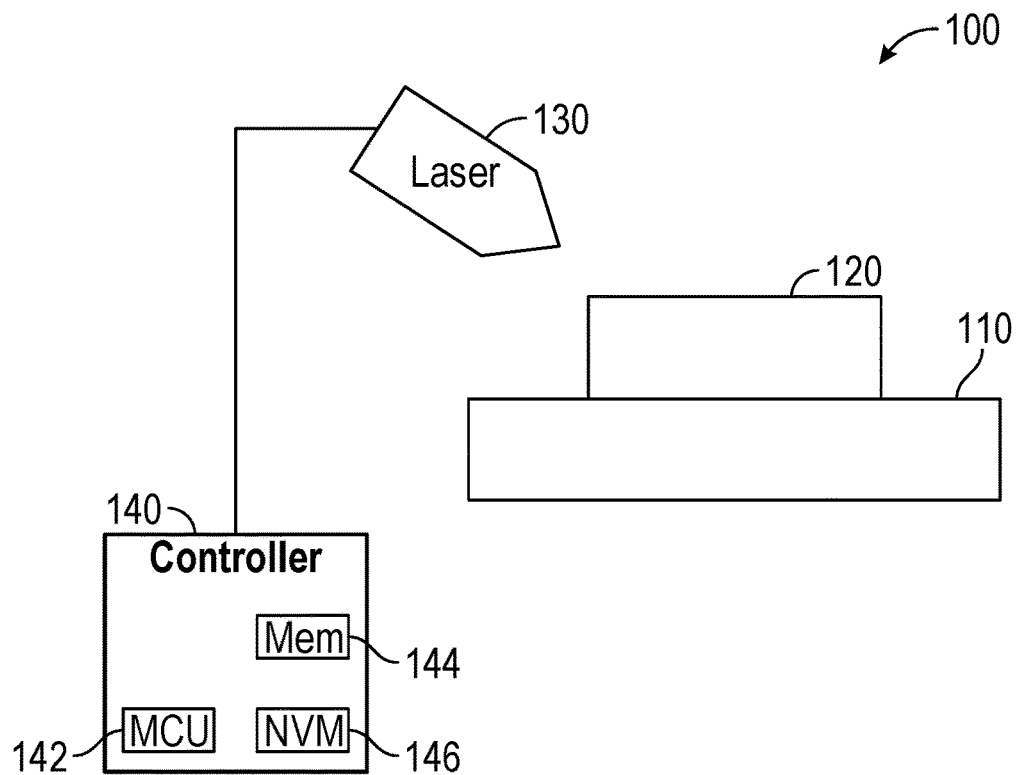
FIG. 1A is a workspace environment in accordance with an embodiment.

In various embodiments, a decapsulation technique is provided to preserve intact bond wires, including silver (Ag) bond wires inside a packaged semiconductor device, after a mold compound or other encapsulant is removed to expose one or more die. This technique preserves the electrical characteristics of the device for further electrical testing, fault isolation, etc. Decapsulating devices typically involves the use of acids such as fuming nitric acid, sulfuric acid, etc. Such acids attack bond wires and cause them to break during the decapsulation process, and conventional acid etch processes can be particularly deleterious for silver bond wires.

More particularly, in an embodiment a two-step decapsulation technique is provided for Ag wire-included devices. The first step involves using a laser to ablate the encapsulant materials above the die, creating a several micron deep well. The laser settings (e.g., power, current, scan angle) may be adjusted so that a number of laser run scans are executed to remove several thin layers of mold compound for better control. At the end of this first step, a threshold thickness (e.g., approximately 1 micron (um) thick layer) of mold compound remains above the die. That is, this first step process may be controlled to ensure that not all mold compound above the die is removed, since the laser could damage an exposed die.

The second step involves a minimal acid etch process (e.g., several drops of fuming nitric acid (f-HNO$_3$)) (e.g., 95% fuming nitric acid) to remove the remaining thin layer of mold compound to reveal the die surface. The laser-ablated device is placed on a hot plate with a temperature of 55-65 degrees Celsius. A drop of f-HNO$_3$ is placed in the well created by the laser and etching of the remaining mold compound is allowed to run for a minimal time duration (e.g., 20 seconds). The partially etched device is rinsed (e.g., with acetone), sonicated (e.g., in a beaker of acetone), and then placed on the hot plate to evaporate the acetone. Blowing air to dry off the acetone is possible as long as the Ag wires do not get disturbed. Subsequent drops of f-HNO$_3$ may be used as desired to entirely expose the die. For these iterative acid etch processes, the acid etching time may be reduced to 5 seconds or less, such that total time of exposure to acid etching is less than two minutes, and in many examples less than a minute.

This two-step technique is a low cost and efficient method for Ag wire decapsulation. In contrast, a conventional decapsulation tool to decapsulate devices with Ag wires can cost between $500,000 and $1,000,000. All bond wire integrity can be preserved using embodiments. Still further, the entire process takes less than an hour and minimal acid waste is generated. In contrast, conventional decapsulation processes may take longer and can incur much greater amounts of acid waste, e.g., 16 ounces or more per semiconductor package.

With embodiments, silver bond wires may be exposed and their integrity preserved. In addition, one or more die of a device can be fully/partially exposed. In this way, electrical fault isolation is possible (partially exposing the die may be sufficient so long as a region of interest is not covered by mold compound). In one scenario, a defect may be suspected to be on the die, and thus exposing the die with the silver bond wires preserved for electrical fault isolation/characterization may occur. In another scenario, the device may be failing due to defective silver bond wire itself, or due to improper ball bond formation on a bond pad, such that fully exposing the silver bond wires while preserving their integrity may occur for inspection with microscope.

Referring now to FIG. 1A, shown is a workspace environment in accordance with an embodiment. As shown in FIG. 1A, workspace environment 100 may be present in a semiconductor designer and/or manufacturer facility to perform decapsulation processes such as described herein. In the high level view shown in FIG. 1A, workspace environment 100 may be used for a first step of a two-step decapsulation technique to safely decapsulate a semiconductor device, while protecting its silver bond wires.

In the stylized view shown in FIG. 1A, workspace environment 100 includes a support assembly 110 onto which a semiconductor package 120 is placed. Understand that support assembly 110 may provide a frame or other support structure onto which semiconductor device 120 may be adapted. As further shown, a laser 130 is present and during a first step may be focused onto a top surface of the semiconductor package 120. While embodiments may vary, in typical examples, laser 130 may be positioned at a distance of between approximately 30 and 40 centimeters vertically above a top surface of semiconductor device 120, and aligned so that the light energy hits semiconductor device 120 at an angle of approximately 90 degrees.

In the embodiment shown, laser 120 may be automatically controlled by a controller 140, which may be implemented as a computer or other dedicated controller to control movement, intensity and so forth of laser 130. In an embodiment, controller 140 may control power, current, frequency, wavelength, speed, pulse width, scan angle, number of scans, scan overlap percent, unidirectional/bidirectional scan of laser 120. To this end, controller 140 may include a microcontroller unit 142 that may execute instructions stored in one or more of a memory 144 and a non-volatile memory 146. In embodiments herein, a user may program controller 140 with a control program to cause laser 130 to dynamically scan across a top surface of semiconductor device 120 to remove a desired amount of the package material, which may be formed of a mold compound or other encapsulant. Understand while shown at this high level in the embodiment of FIG. 1A, many variations and alternatives are possible. For example, additional components such as an enclosure and other components may be present.

Figure 1B:
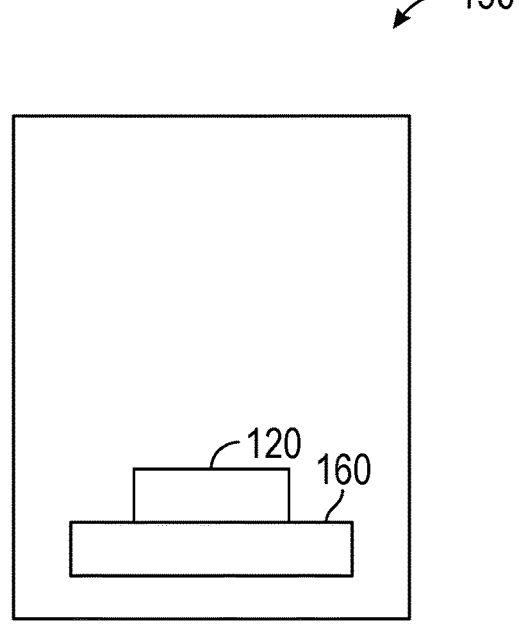
FIG. 1B is another workspace environment in accordance with an embodiment.

Referring now to FIG. 1B, shown is another workspace environment in accordance with an embodiment. As shown in FIG. 1B, workspace environment 150 may be present in the semiconductor designer/manufacturer facility to perform decapsulation processes as described herein. In the high level view shown in FIG. 1B, workspace environment 150 may be used for a second step of a two-step decapsulation technique. As shown, work environment 150 may be provided as an enclosure having a hot plate 160 onto which semiconductor device 120 may be placed. Note that at the point at which semiconductor device 120 is placed into this work environment, a substantial amount of mold compound or other encapsulant above one or more die of the semiconductor device may already have been removed via a first step laser etching process as discussed above. Understand that in FIG. 1B, work environment 150, which is used to perform acid etching, may include a fume hood. Using work enclosure 150 a given acid may be placed onto semiconductor device 120, e.g., one or a small number of drops, which may remove the remainder of the undesired mold compound. An iterative acid etch process may be performed in which a single drop of acid is placed and allowed to remain for a short time duration. Thereafter, rinsing and drying operations may be performed between the iterations.

Figure 2:
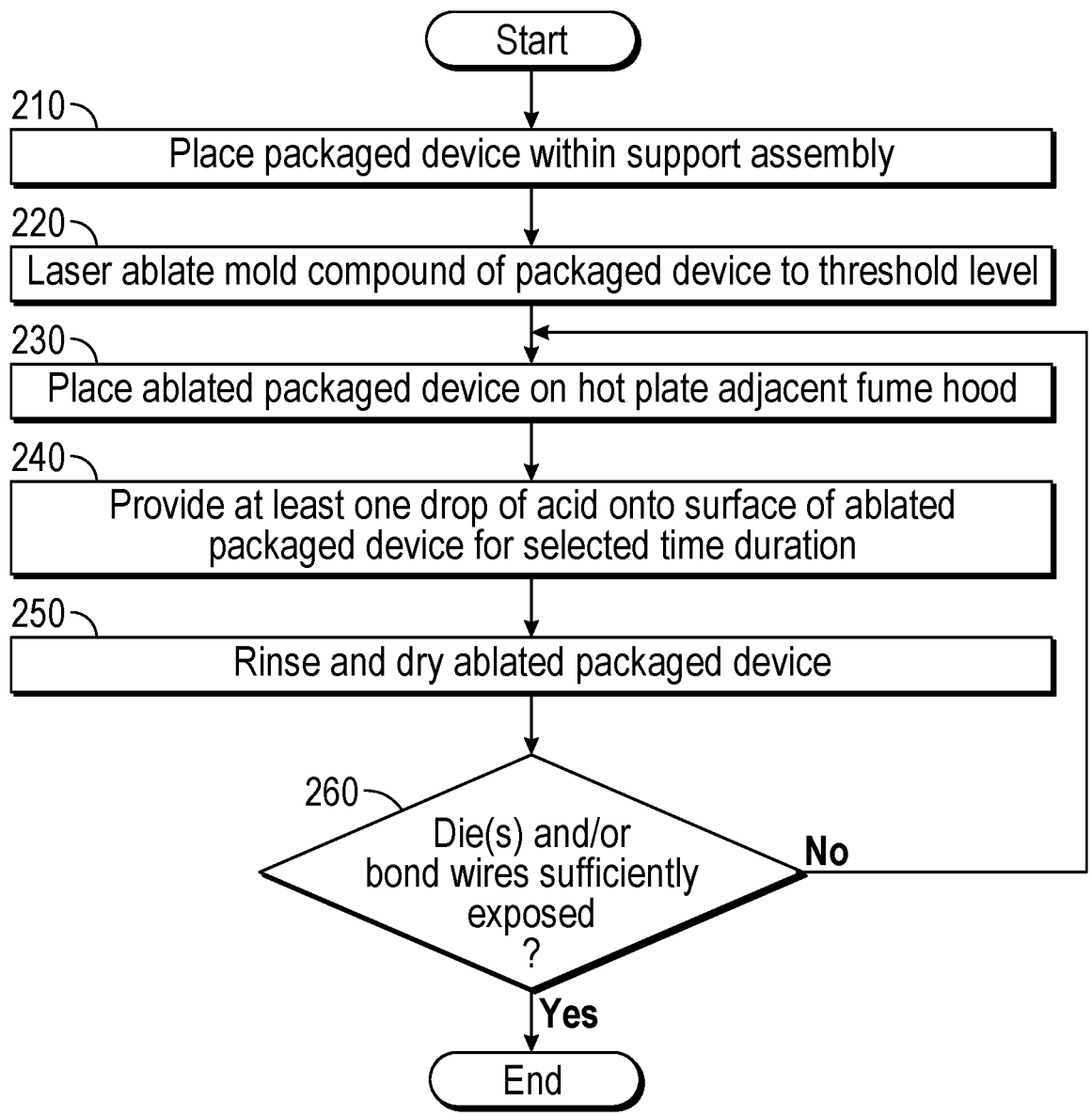
FIG. 2 is a flow diagram in accordance with an embodiment.

Referring now to FIG. 2, shown is a flow diagram of a method in accordance with an embodiment. As shown in FIG. 2, method 200 may be performed to decapsulate a semiconductor package having silver bond wires therein. Method 200 begins by placing the packaged device within a support assembly (block 210). For example, the semiconductor device can be placed onto the support assembly and affixed into place. Next at block 220, a mold compound of the packaged device may be laser ablated to a threshold level. Understand that this threshold level may vary but in general, laser ablation may be performed as a series of scans which remove the mold compound that is at least substantially over one or more die included in the semiconductor package. In a particular embodiment, this threshold level may be approximately one micron of thickness, such that some mold compound remains over the die, while certain regions within the semiconductor device may be more or less exposed.

Still referring to FIG. 2, next at block 230, after the laser ablation is performed to the threshold level, the ablated packaged device may be placed on a hot plate that is adjacent a fume hood (block 230). Although embodiments may vary, this hot plate may be set at a temperature of approximately 65 degrees Celsius. Next at block 240, at least one drop of acid may be placed onto the surface of the ablated packaged device, e.g., in a well formed by the laser ablation. This fine-grained acid etch process may occur for a minimal time duration. For example, in a first iteration, the acid may be allowed to remain on the surface for approximately 20 seconds. Thereafter, at block 250 the ablated packaged device may be rinsed and dried. For example, the device can be rinsed with acetone and placed into a beaker or other structure having acetone and then sonicated using an ultrasonic tool placed within the fume hood to clear the acid and etched mold compound materials for about 3 seconds each time. Then a drying process may be performed which may be an active or passive drying process.

Still with reference to FIG. 2, next at diamond 260, it may be determined whether one or more die within the package and/or the bond wires are sufficiently exposed. A user may analyze the device, possibly under microscope if needed to identify whether decapsulation has been performed to a desired level, such that desired portions of one or more die are exposed, as well as bond wires, to enable various debug or other testing operations to be performed. If additional mold compound is desired to be removed based on this analysis, control passes back to block 230 discussed above. Otherwise, the package is sufficiently decapsulated to enable desired debug and/or test operations to occur. Note that in typical scenarios, only a few iterations may occur, such that the total time that the device is exposed to acid etching may be less than one minute. Understand while shown at this high level in the embodiment of FIG. 2, many variations and alternatives are a possible.

Figure 3A:
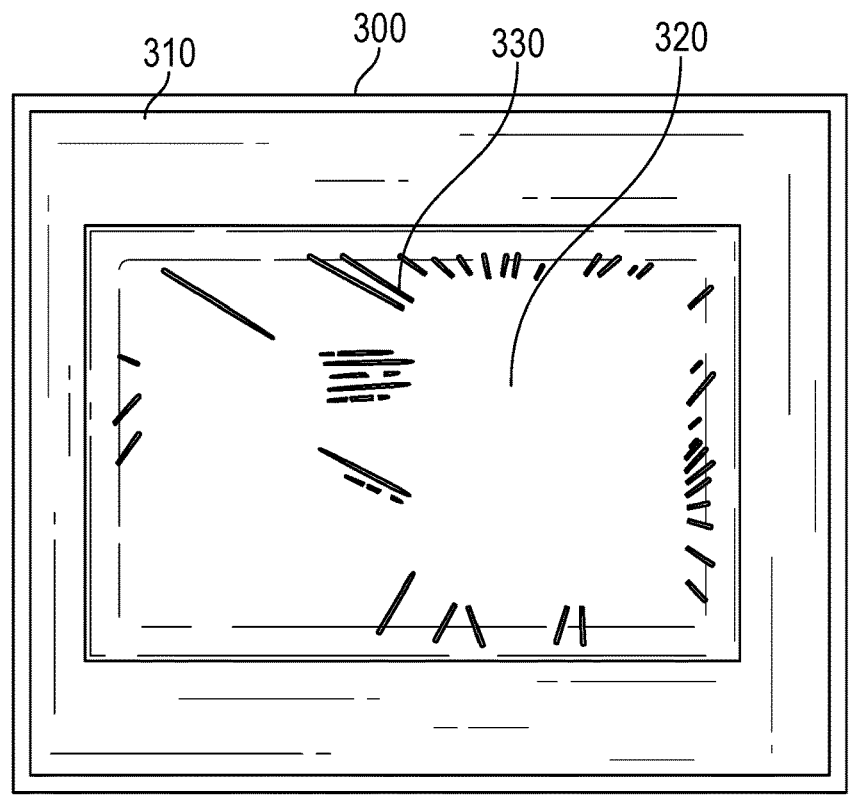
FIG. 3A is an illustration of a semiconductor package after a first step of a decapsulation process in accordance with an embodiment.

Referring now to FIG. 3A, shown is a top view of a partially decapsulated semiconductor package in accordance with an embodiment. As shown in FIG. 3A, semiconductor package 300 is shown after a laser ablation process has been performed. In this view, a periphery portion 310 is shown in which mold compound remains and has not been substantially etched, and an interior portion 320 that includes some remaining mold compound after laser ablation. As seen, various partially exposed bond wires 330 are present, which in this embodiment may be silver bond wires. As described above, a number of scans may be performed to enable ablation to the desired threshold level.

Figure 3B:
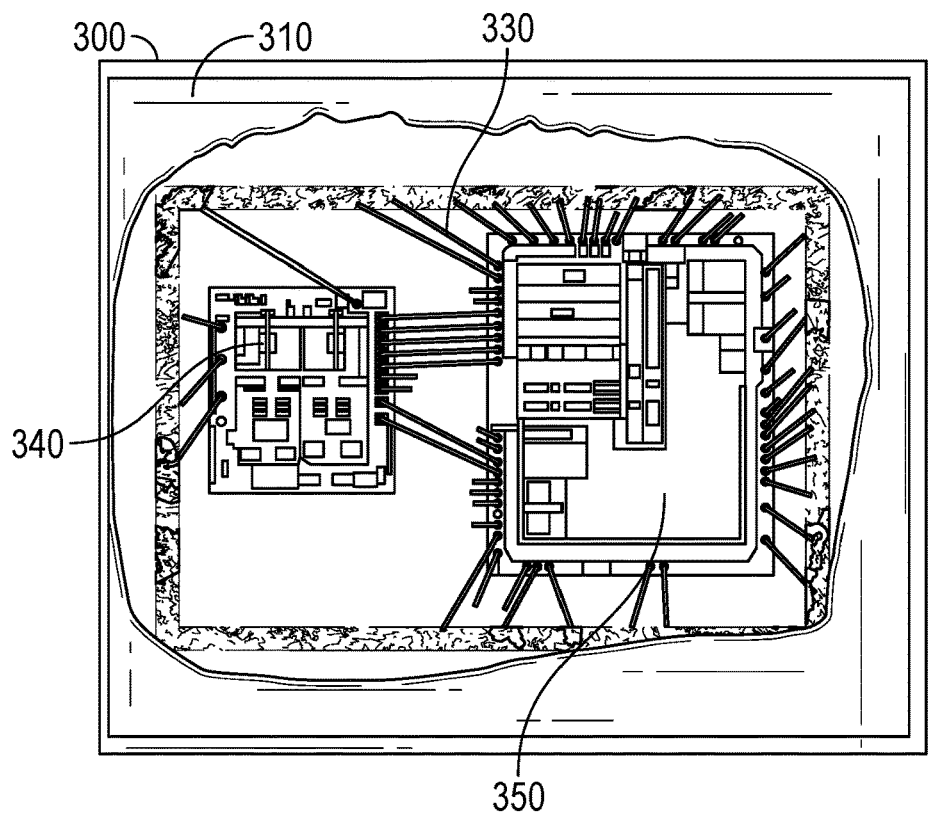
FIG. 3B is an illustration of a semiconductor package after a second step of a decapsulation process in accordance with an embodiment.

Referring now to FIG. 3B, shown is the same semiconductor package 300 after decapsulation has been completed by additional performance of a second step acid etch process. As shown, after the minimal acid etching such as discussed above, two die 340 and 350 are exposed, along with the various bond wires 330 that connect to corresponding bond pads of these die. With this two-step process, acceptable decapsulation is realized, while preserving the silver bond wires.

As shown in FIG. 3B, two die are present, and may be coupled with silver bond wires. Understand that in some implementations, additional bond wires, e.g., to a periphery of the package may be formed of silver and/or gold. Also note that while a multi-die package is shown, other implementations may have a single die. With multiple die, different functionality can be performed by the two die. For example, radio frequency (RF) communications may occur via one die and digital processing can be performed via the other die. Of course other functionality is possible in other cases.

Figure 4:
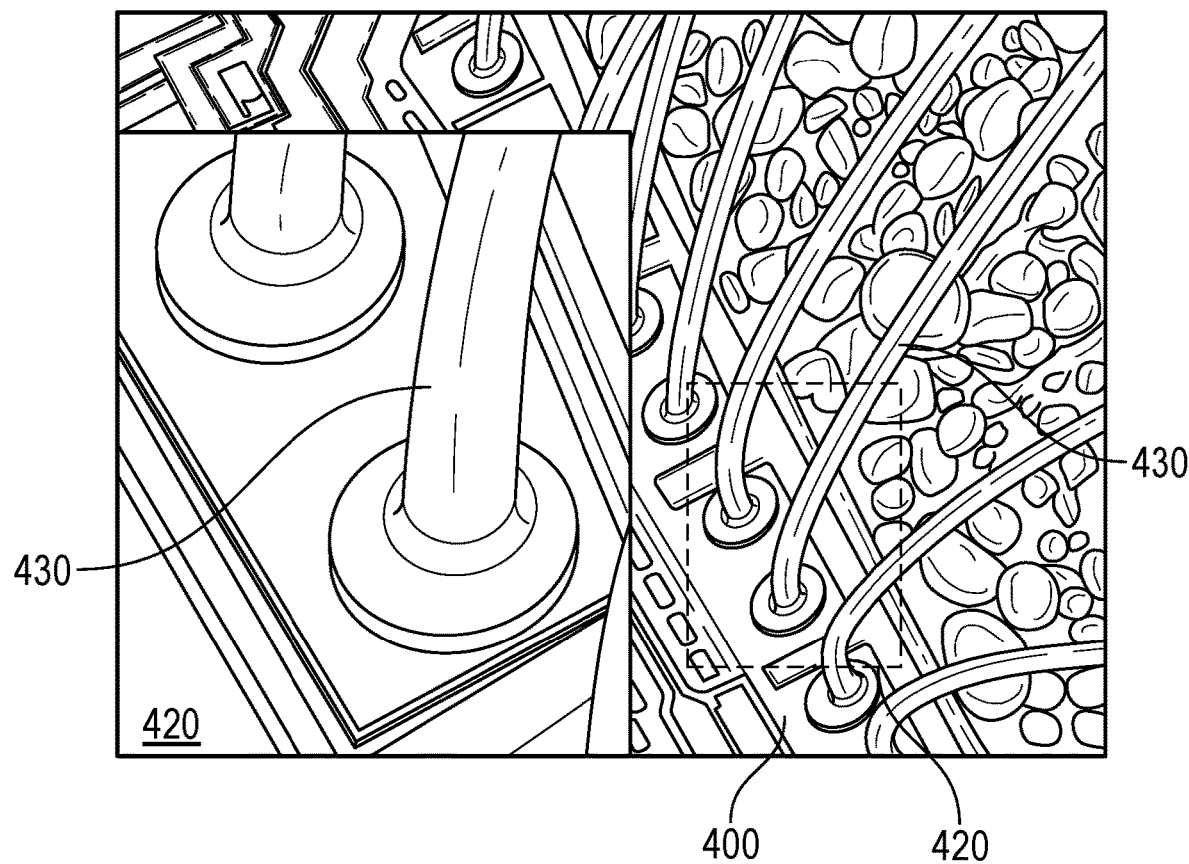
FIG. 4 is a graphical illustration of silver bond wires exposed using a decapsulation process in accordance with an embodiment.

Referring now to FIG. 4, shown is an illustration of silver bond wires that have been successfully exposed using a decapsulation process in accordance with an embodiment. As illustrated in FIG. 4, in a decapsulated semiconductor package 400 various bond wires 430 are present that couple to corresponding bond pads of a given die.

As illustrated in inset 420, a given bond wire 430 is fully intact, and has not been undesirably etched via a conventional acid etch process. Instead with a two-step decapsulation technique as described herein, complete electrical functionality of bond wires 430 remain, allowing a full range of testing or other debug operations to occur.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. A system comprising:
a first workspace environment comprising:
a laser to laser ablate mold compound from a semiconductor package; and
a controller coupled to the laser to control the laser to execute a plurality of scans to laser ablate the mold compound to a threshold level; and
a second workspace environment comprising:
a hot plate; and
a fume hood adapted about the hot plate, wherein the laser ablated semiconductor package is to be adapted to the hot plate and to be acid etched to expose one or more die and one or more silver bond wires of the semiconductor package, wherein a total time of exposure of the semiconductor package to the acid etch is less than two minutes.

2. The system of claim 1, wherein the controller is to control the laser to laser ablate the mold compound to the threshold level at which the one or more die of the semiconductor package remain covered with at least a portion of the mold compound.

3. The system of claim 1, wherein the controller is to control the laser to have a first power, a first current, and a first scan angle for the laser ablation.

4. The system of claim 1, further comprising a non-transitory storage medium comprising instructions, wherein the controller is to execute the instructions to cause the laser to execute the plurality of scans.

5. The system of claim 1, wherein the first workspace environment comprises a support assembly on which the semiconductor package is to be adapted.

6. The system of claim 5, wherein during the laser ablation, the laser is positioned at an angle of approximately 90 degrees with respect to the support assembly.

7. The system of claim 1, further comprising sonication means for sonicating the semiconductor package after the acid etch.

8. The system of claim 7, further comprising rinsing means for rinsing the semiconductor package after the acid etch.

9. A system comprising:
a first workspace environment comprising:
a laser to laser ablate mold compound from a semiconductor package comprising at least one die and silver bond wires; and a controller coupled to the laser to control the laser to execute a plurality of laser run scans to laser ablate the mold compound to a threshold level above the at least one die; and a second workspace environment comprising:
a hot plate; and
a fume hood adapted about the hot plate, wherein the laser ablated semiconductor package is to be adapted to the hot plate and to be acid etched to expose the at least one die and the silver bond wires.

10. The system of claim 9, wherein the laser is adapted in the first workspace environment to be positioned at a predetermined distance from the semiconductor package.

11. The system of claim 9, wherein the first workspace environment comprises an enclosure to enclose at least the laser.

12. The system of claim 11, wherein the first workspace environment comprises a support surface to support the semiconductor package.

13. The system of claim 9, wherein in the second workspace environment, the semiconductor package is to be exposed to the acid etch for a total time of exposure of less than two minutes.

14. The system of claim 9, further comprising a non-transitory storage medium comprising instructions, wherein the controller is to execute the instructions to cause the laser to execute the plurality of laser run scans and control the laser to have a first power, a first current, and a first scan angle for the laser ablation.

15. A method comprising:
in a first workspace environment comprising a laser and a controller coupled to the laser for controlling the laser, executing a plurality of laser run scans via the laser to ablate an encapsulant of a semiconductor package comprising at least one die and silver bond wires above at least a portion of the at least one die and the silver bond wires, until a threshold amount of the encapsulant remains above at least the portion of the at least one die and the silver bond wires; and in a second workspace environment comprising a hot plate and a fume hood adapted about the hot plate, providing at least one drop of acid onto a surface of the ablated semiconductor package to remove a remaining portion of the encapsulant above the one or more die and expose the at least one die and the silver bond wires.

16. The method of claim 15, further comprising iteratively providing a single drop of the acid onto the surface of the ablated semiconductor package until the at least one die is sufficiently exposed.

17. The method of claim 15 further comprising iteratively providing a single drop of the acid comprising fuming nitric acid onto the surface of the ablated semiconductor package and thereafter rinsing the ablated semiconductor package, until the at least one die is sufficiently exposed.

18. The method of claim 15, further comprising:
adapting the ablated semiconductor package on the hot plate having a temperature of less than approximately 65 degrees Celsius, and
providing the at least one drop of acid onto the surface of the ablated semiconductor package while on the hot plate having the temperature of less than approximately 65 degrees Celsius.

19. The method of claim 15, further comprising providing the at least one drop of acid onto the surface of the ablated semiconductor package for a time duration less than 20 seconds.

20. The method of claim 15, further comprising:
rinsing the ablated semiconductor package of the acid; and
sonicating the ablated semiconductor package after the rinsing.

* * * * *